United States Patent [19]

Lee

[11] Patent Number: 5,596,213

[45] Date of Patent: *Jan. 21, 1997

[54] SHALLOW TRENCH SOURCE EPROM CELL

[75] Inventor: Roger Lee, Boise, Id.

[73] Assignee: Micron technology, Inc., Boise, Id.

[*] Notice: The term of this patent shall not extend beyond the expiration date of Pat. No. 5,297,082.

[21] Appl. No.: 403,328

[22] Filed: Mar. 14, 1995

Related U.S. Application Data

[60] Continuation of Ser. No. 208,753, Mar. 8, 1994, Pat. No. 5,445,981, which is a division of Ser. No. 976,226, Nov. 12, 1992, Pat. No. 5,297,082.

[51] Int. Cl.⁶ .................................... H01L 29/788
[52] U.S. Cl. .......................... 257/316; 257/322
[58] Field of Search ................... 257/316, 322, 257/315

[56] References Cited

U.S. PATENT DOCUMENTS

| | | | |
|---|---|---|---|
| 5,019,527 | 5/1991 | Ohshima et al. | 437/43 |
| 5,278,438 | 1/1994 | Kim et al. | 257/316 |

FOREIGN PATENT DOCUMENTS

| | | | |
|---|---|---|---|
| 4-209573 | 7/1992 | Japan | 257/316 |

*Primary Examiner*—Robert P. Limanek
*Attorney, Agent, or Firm*—Kevin D. Martin

[57] ABSTRACT

A Flash EPROM cell having buried source-side injection allows for low voltage programming from the source side. A cell having the inventive structure can be programmed at 4.0 V or less. The inventive cell comprises a source area which is at a lower plane than the drain region, and a program charge is transferred to the floating gate through the source-side injector. Instead of using a self-aligned high-energy n-type dopant implant at the source side to form the source side injector as used with previous cells, which can be difficult to control, etching the substrate before impurity doping allows for the controllable formation of a sharp point of doped silicon, and allows for improved programming at a lower voltage.

20 Claims, 7 Drawing Sheets

SHALLOW TRENCH SOURCE EPROM CELL

This is a continuation of application Ser. No. 08/208,753, filed Mar. 8, 1994, now U.S. Pat. No. 5,445,981, which was a division of application Ser. No. 07/976,226, filed Nov. 12, 1992, now U.S. Pat. No. 5,297,082.

FIELD OF THE INVENTION

The invention relates to the field of programmable read only memories, and more specifically, is a structure and process for use with erasable programmable read-only memories (EPROMs) and flash electrically erasable programmable read-only memories ($E^2$PROMs).

BACKGROUND OF THE INVENTION

EPROMs and Flash $E^2$PROMs (hereafter collectively, PROMs) have several structures which allow them to hold a charge without refresh for extended periods of time (see FIG. 1). The charge itself is stored on a "floating gate" 10 also referred to as Poly 1 or P1, which is a structure of polycrystalline silicon (hereafter, poly) surrounded on all sides by a layer of oxide 12. Located superjacent and parallel to this P1 structure is another poly structure, the word line or "control gate" 14 or P2. P1 10 and P2 14 act as the two plates of a capacitor. Below the P1 layer are two N+ junctions, one which acts as the transistor source 16 and the other as the drain 18, which are doped into a p-type substrate 20. The portion of the substrate 20 between the source 16 and the drain 18 is the channel 22. The cell of FIG. 1 functions like an enhancement-type n-channel metal oxide semiconductor field effect transistor (MOSFET) with two gates of poly.

There are many ways to program a flash $E^2$PROM. For example, a high voltage, such as 12 V, is applied to the control gate. Then a voltage pulse such as 8V is applied between source and drain. The large positive voltage on the control gate establishes an electric field in the insulating oxide. This electric field attracts the electrons generated from the so-called avalanche breakdown of the transistor due to the high drain and control gate voltages and accelerates them toward the floating gate, which they enter through the oxide. In this way the floating gate is charged and the charge that accumulates on it becomes trapped.

To return the floating gate from a charged state to a state with no charge, the charge is returned to the substrate or other electrodes. In an EPROM, this is accomplished with ultraviolet light which excites the electrons past a certain energy state, thereby allowing them to pass through the oxide. In an $E^2$PROM, this is accomplished with an electrical field.

The voltage which must be applied on the control gate to turn on the transistor is much higher in a device storing a charge than in a device which does not have a voltage potential stored on P1. To read the content of the floating gate, a voltage somewhere between the low and high voltage values (i.e. the threshold voltage $V_t$) is applied to the control gate. A cell that trips at $V_t$ has no charge stored on P1, while a cell which does not trip is determined to be storing a charge.

There are structures which make up a PROM array which are common to several transistors in the array. FIG. 2 shows a top view of an array showing transistor sources 16, drains 18, digit lines 24, floating gates 10, and control lines 26 which form control gates 14 as they pass over the floating gates 10. Also shown as a dotted line is the "active area" 28 interspersed with areas of field oxide 30. As shown in FIG. 2, a single control line 26 is common to all transistors in a single column, and when selected it activates all transistors in the column. The source regions 16, which run parallel with the control lines 26, are common to all transistors in two adjacent columns. Individual transistor drains 18 are common to two transistors in adjacent columns. The digit (or bit) lines 24 are common with the drains 18 all transistors in a single row.

To read the datum on a floating gate 10, the control line 26 of the cell to be read is activated which causes all transistors in the selected column to become active and to output the cell information on their respective digit lines 24. The information on the digit line 24 which corresponds to the cell to be read is obtained with a sense amplifier (not shown), with one sense amp for each digit line.

The active area 28 is defined during the manufacturing process after the thin pad oxide is initially formed on the surface of the wafer. After the pad oxide is formed on the surface of the wafer a layer nitride is formed and a patterned layer of photoresist is formed over the nitride. The exposed nitride is removed, and the exposed oxide is further oxidized. The nitride prevents the growth of the oxide underneath it, while allowing the exposed oxide to grow. The area under the nitride which remains thin is referred to as the gate oxide and is also called the active area. The exposed oxide which thickens becomes the field oxide. During a spacer etch, the gate oxide will erode away to bare silicon, as it is thinner than the field oxide. The bare areas can then be doped, with the field oxide protecting the other silicon areas from being doped.

There are many methods used to manufacture Flash $E^2$PROM and EPROM memory, one of which is shown in FIGS. 3–7. To obtain the structure of FIG. 1, a first blanket layer of oxide, the pad oxide, is formed on top of the silicon substrate. Nitride is patterned in a criss-cross pattern on the oxide to define the active area 28 as shown in FIG. 3, and the field oxide 30 is formed from the exposed pad oxide while the unexposed pad oxide becomes the gate oxide 28. As shown in FIGS. 4A and 4B, a first blanket layer of poly 40 which will make up P1 is formed on the appropriate areas of the gate oxide 28, and a second layer of oxide 42 and a layer of nitride 44 (or a nitride-oxide sandwich), which separate P1 from a second poly layer is formed on the first poly layer 40. The P1 layer is patterned with a layer of resist 46 in rows, perpendicular to the source lines of the active area. As shown in FIG. 5, after a P1 sidewall oxidation (not shown) a second blanket poly layer 50, P2, is formed on the nitride layer 44 (or nitride-oxide), and an optional oxide layer 52 is formed on the Poly 2 50 layer, and photoresist 54 is patterned on the surface in columns perpendicular to the rows of P1 40. An etch forms the floating gates 10 and control gates 14. Referring to FIG. 6, a third blanket layer of oxide 60 is formed and etched, which forms the spacers 70 as shown in FIG. 7. During the spacer etch, exposed gate oxide 28 is also removed, thereby exposing the areas of silicon which will later become the transistor diffusion areas.

After the structure of FIG. 7 is formed, the substrate 20 is doped to form the N+ areas of the transistor sources 16 and drains 18, and conductive areas which couple the sources between the rows. An implant source-drain can also be formed before the spacer formation for additional overlap of the impurity regions under the spacers.

A second method of forming the Flash $E^2$PROM structure is described in the article "A 5-Volt Contactless Array 265KBIT Flash EEPROM Technology," M. Gill et al, IEDM, 1988, pp. 428. This structure, which is formed with a buried N+ line process, has higher digit line capacitance, more process complexity, and also has a high degree of lateral diffusion in the buried digit line and is not easily scalable.

With the advent of laptop computers, reducing the power consumption of devices has become a major design focus for engineers. The high voltage required to program and operate Flash EPROMS can decrease the usable battery life of portable and notebook computers.

A Flash EPROM design is described in "Buried Source-Side Injection (BSSI) for Flash EPROM Programming," Cetin Kaya et al, IEEE, 1992, pp. 465–467, which is incorporated herein by reference. Kaya, et al. claims the cell, which has a small cell area, can be programmed in a voltage range of 3–4 V. The device structure comprises the use of a buried source-side injector which requires the formation of a source junction 0.1–0.2 microns (µ) under the silicon substrate surface, and a conventionally designed drain junction. To program the cell the source is grounded while 13 V and 3.5 V are applied to the gate and to the drain respectively. To manufacture the buried source injector, a self-aligned high-energy n-type dopant implant is performed at the source side, which is followed by a heavy dose of As at the drain side. Subsequently, after the sidewall oxide is formed, additional impurities are deposited in the source to reduce the resistance of the diffusion and to form a low-resistance contact region.

In effect, the structure that allows the low-voltage program in the cell of Kaya, et al. is the "sharp corner" of impurities at the source close to the floating gate which forms the source injector. Maximizing the sharpness of the implanted region is a goal of the high-energy implant, but the implant is difficult to control and the shape of the injector will vary widely depending on the subsequent process heat treatment. A cell which has the advantages of the Kaya et al. cell but which allows the sharpness of the source injector to be maximized would be a desirable structure.

SUMMARY OF THE INVENTION

An object of the invention is to provide a Flash EPROM cell structure which allows for low-voltage programming. Other objects and advantages will become apparent to those skilled in the art from the following detailed description read in conjunction with the appended claims and the drawings attached hereto.

The inventive cell comprises the use of a patterned etch to form a vertical wall in the substrate on the source side of the gates. Impurities are then implanted into the source region, which forms a sharp corner of dopant material in the substrate. This sharp corner optimizes the source side injection scheme, thereby allowing the production of a cell which has a lower programming voltage than can be found in conventionally produced Flash EPROM devices. Wafer processing continues using methods known in the art.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
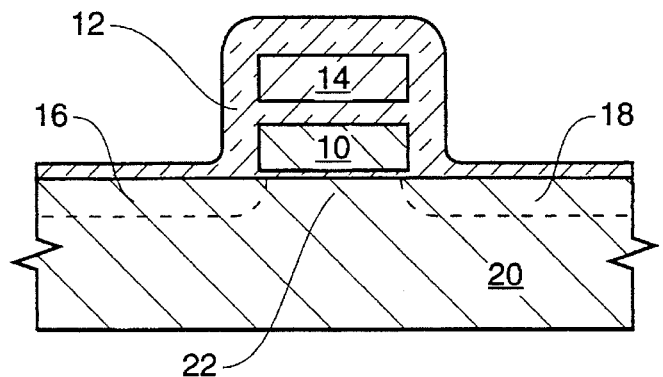
FIG. 1 shows a cross section of a programmable read-only memory having a pair of gates.
Figure 2:
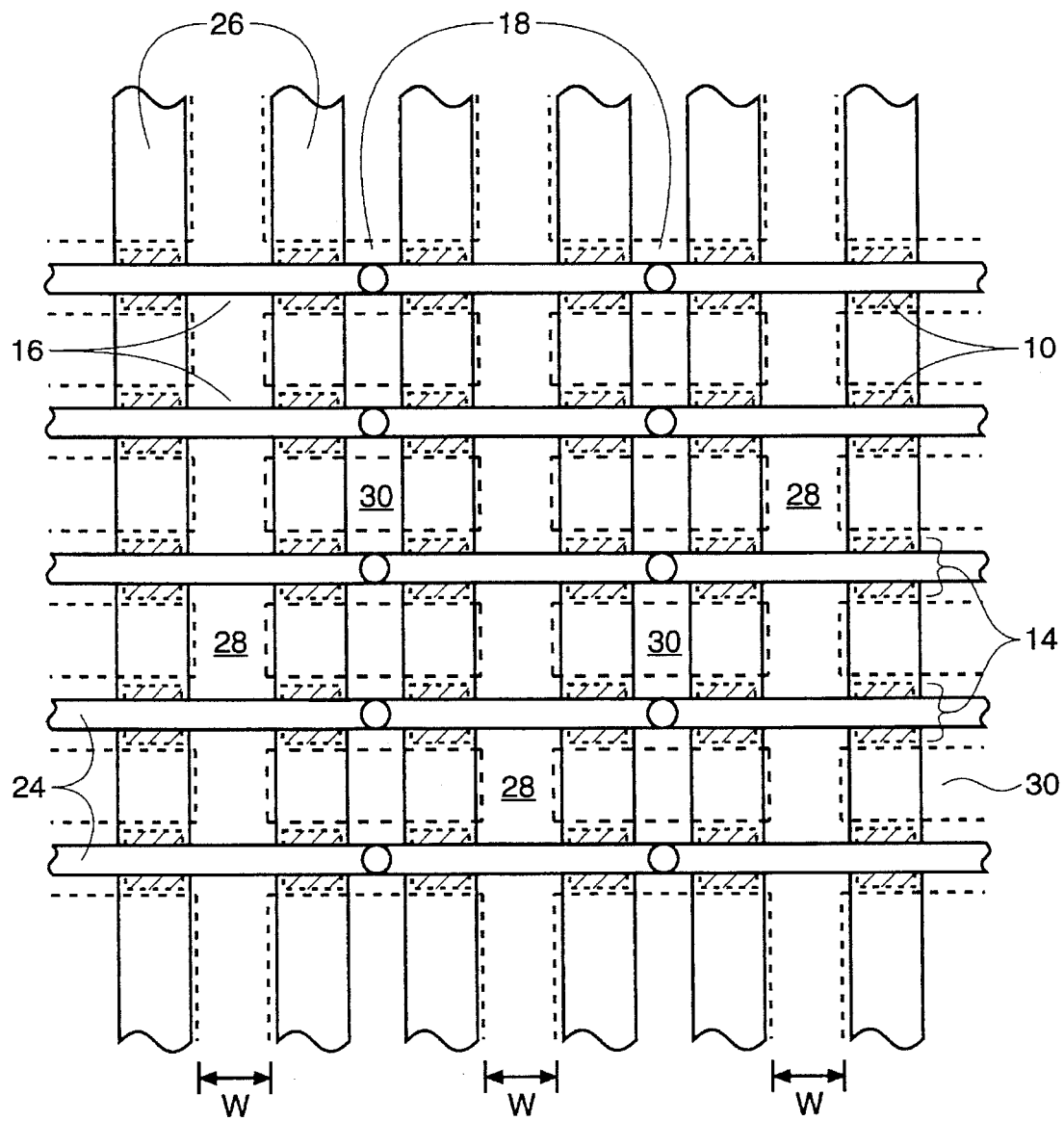
FIG. 2 shows a plan view of a conventional programmable read-only memory.
Figure 3:
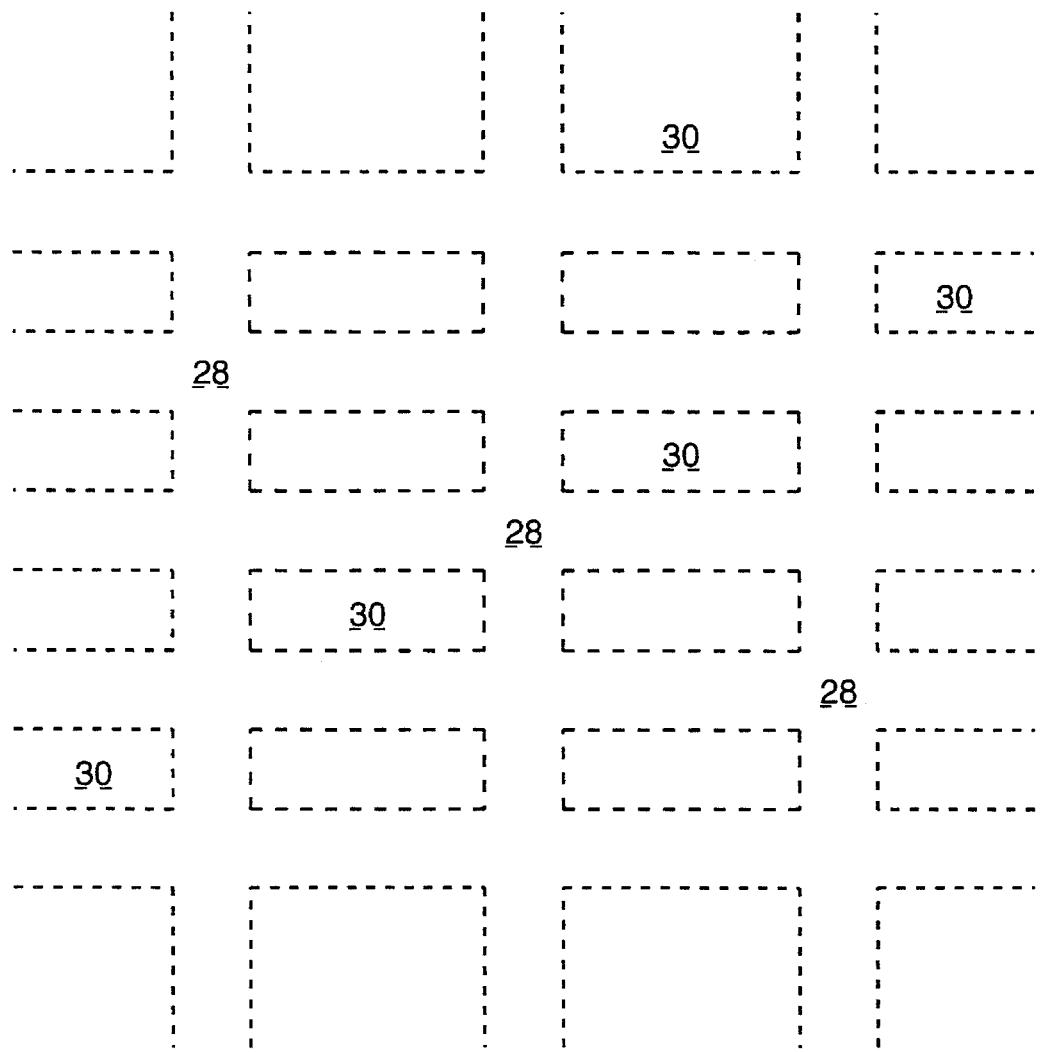
FIG. 3 shows the pattern defined by the gate oxide (active area) and the field oxide of the wafer which will form a conventional programmable read-only memory structure.
Figure 4A:
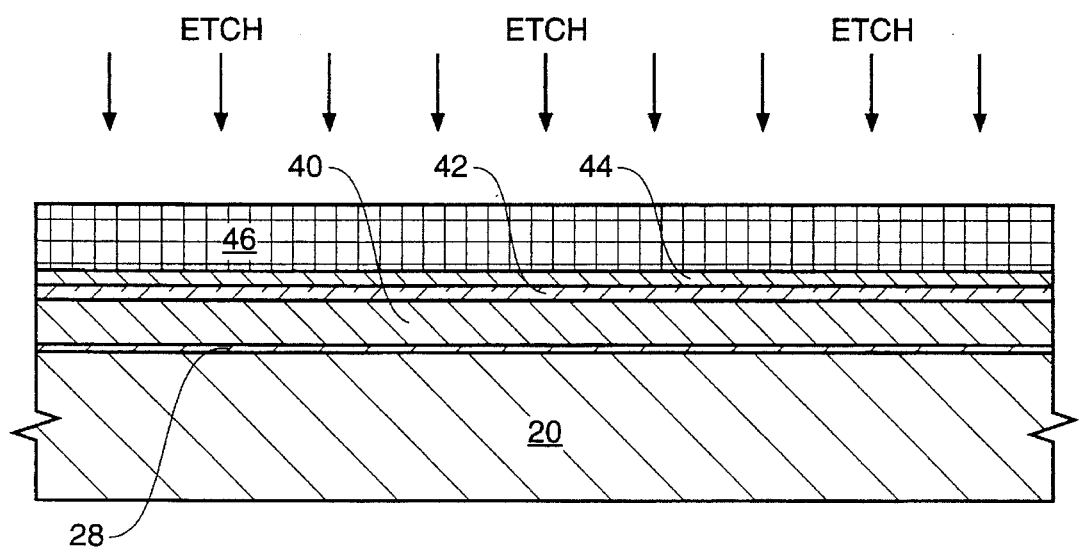
FIG. 4A describes a cross section of a first set of steps to form a conventional programmable read-only memory.
Figure 4B:
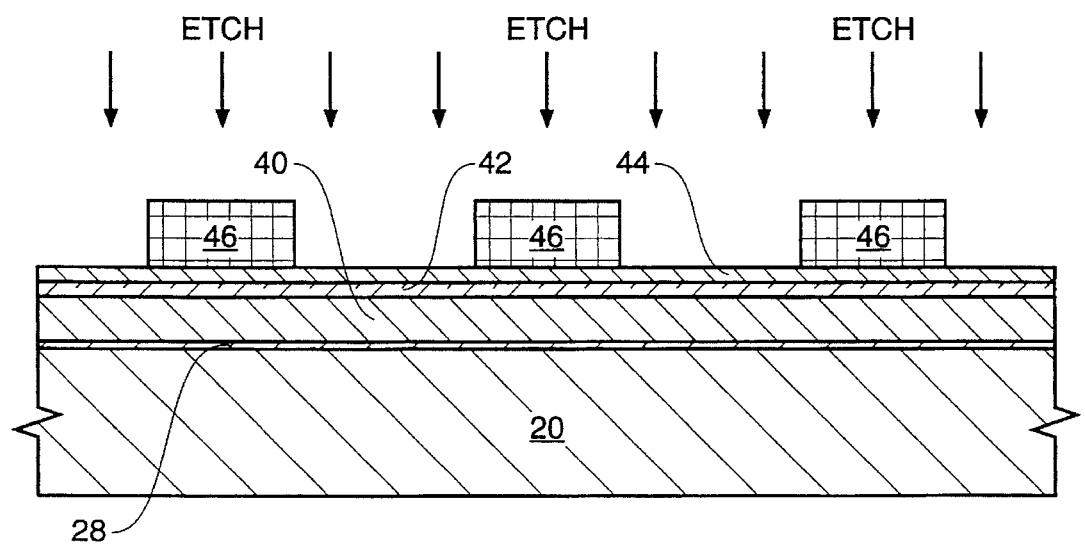
FIG. 4B shows a cross section of the FIG. 4A device, the view being perpendicular to the FIG. 4A view.
Figure 5:
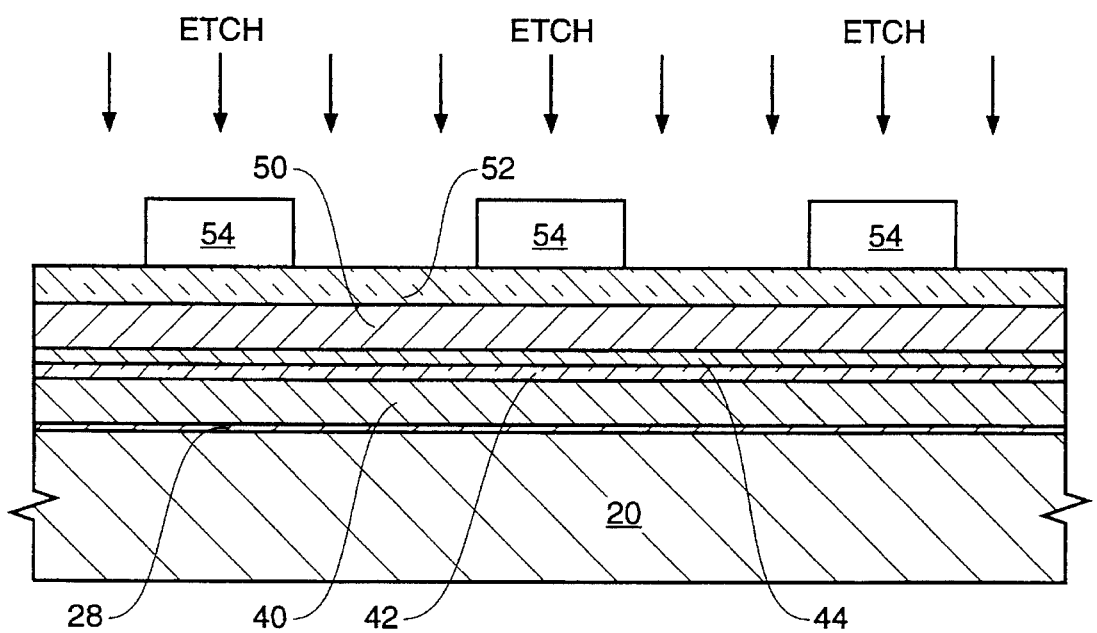
FIG. 5 shows a cross section of a second set of steps to form a conventional programmable read-only memory.
Figure 6:
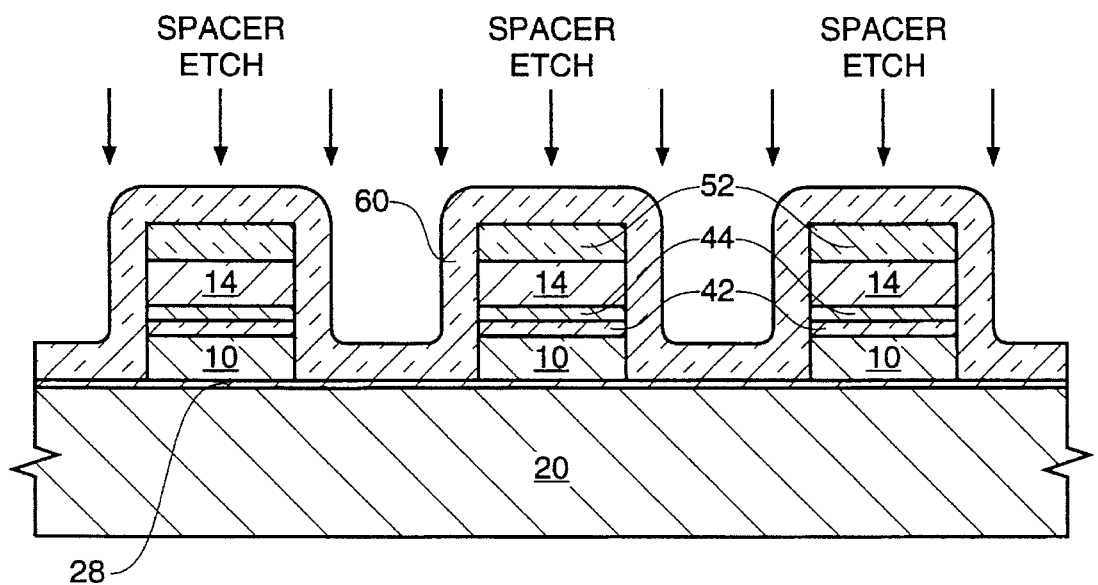
FIG. 6 shows a third set of steps to form a conventional programmable read-only memory.
Figure 7:
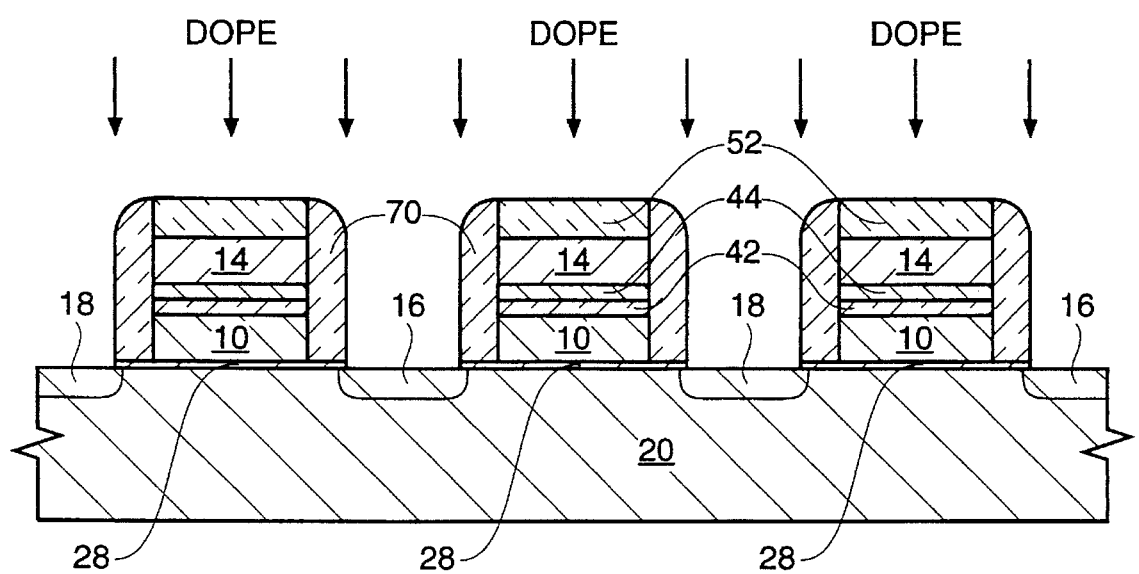
FIG. 7 shows a fourth set of steps to form a conventional programmable read-only memory.
Figure 8:
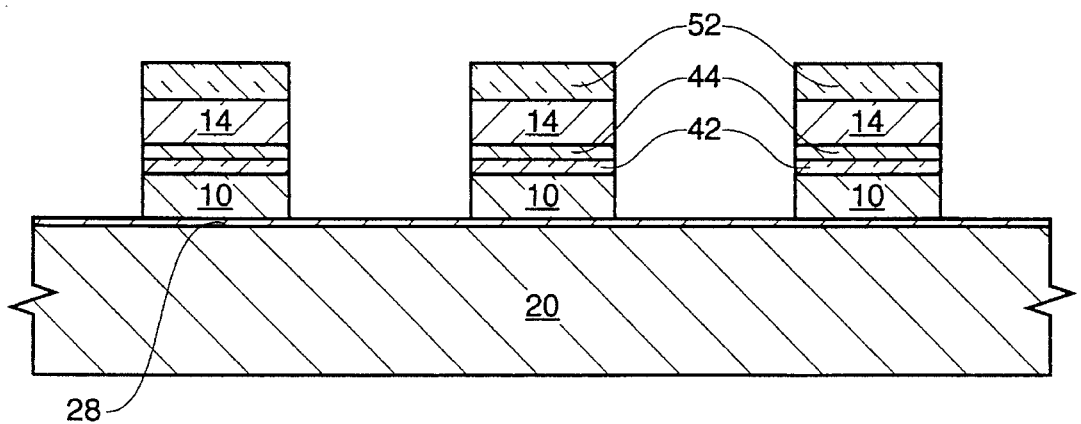
FIG. 8 shows a starting structure for the inventive memory device.

In accordance with one embodiment of the invention, a wafer is manufactured up to the point as shown in FIG. 5 and the etch is performed thereby leaving an oxide layer 52 overlying the control gate 14, which overlies the floating gate 10 as shown in FIG. 8.

Figure 9:
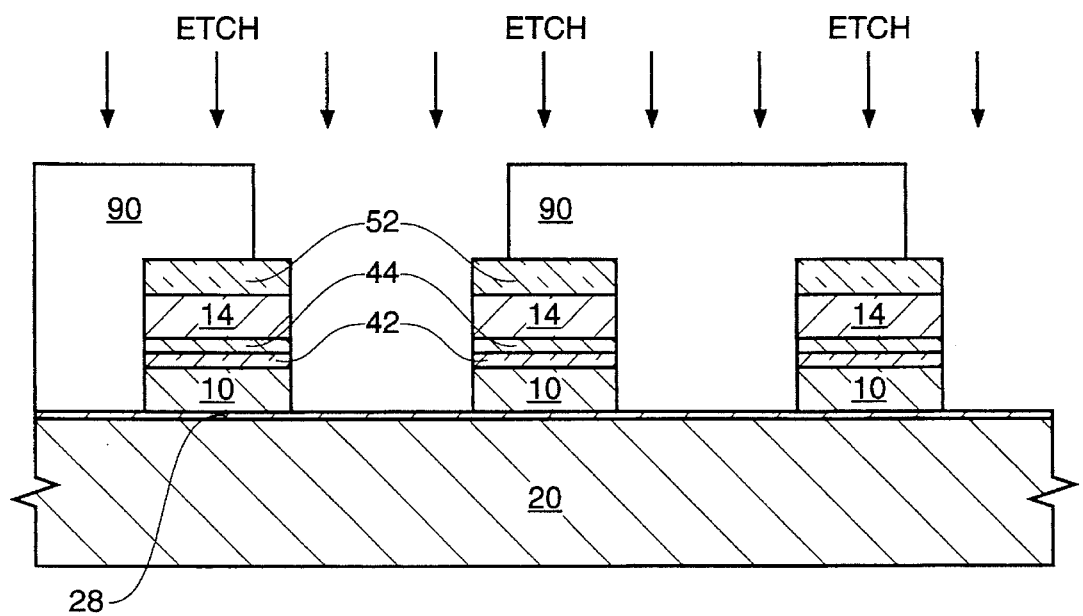
FIG. 9 shows a second set of steps in the manufacture of the inventive memory device.

Next, a patterned layer of photoresist 90 masks off the substrate areas which will form the drain areas, leaving exposed the substrate areas which will be implanted to form the sources, as shown in FIG. 9. The oxide 52 over the control gates 14 allows for a large misalignment of the mask without decreasing the functionality of the structure.

Figure 10:
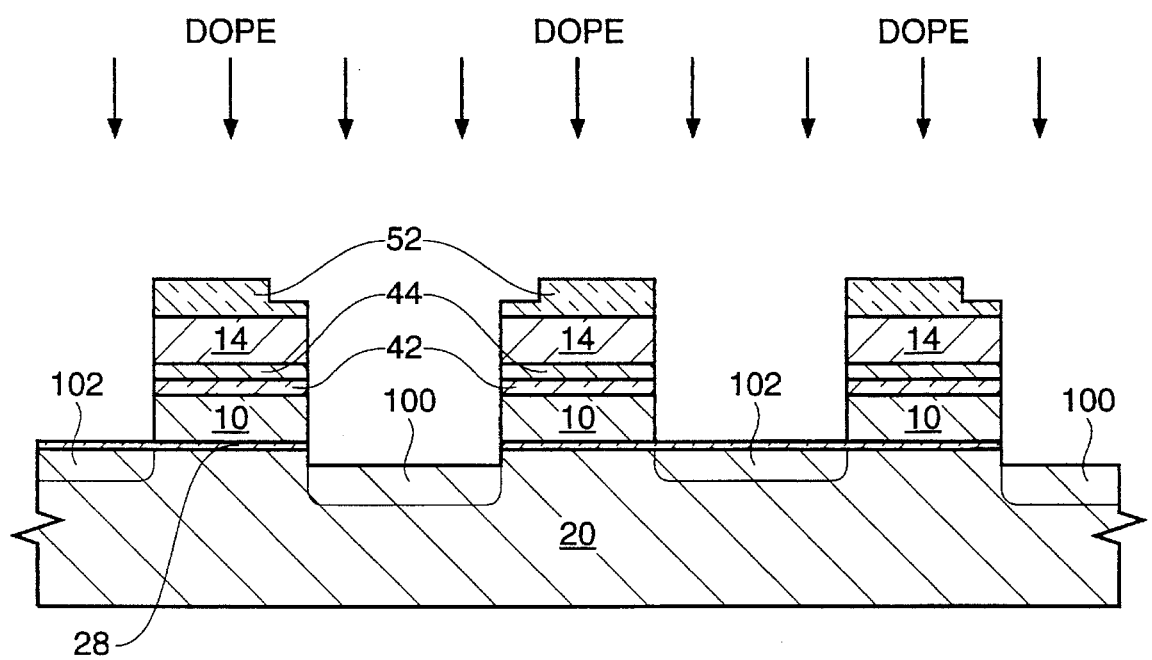
FIG. 10 shows a third set of steps in the manufacture of the inventive memory device.

An etch of the substrate is performed as shown in FIG. 9, then the photoresist is stripped and the substrate doped to result in the FIG. 10 structure. The etch of FIG. 9 recesses the source areas 100 between the control gates 14, thereby making the substrate 20 discontinuous across surface of the die. The drain areas 102 are not recessed. The amount of recess of the source areas 100 can vary, but a trench in the substrate 20 from about 200 Å deep to about 5 KÅ deep would be sufficient, depending on the density of the doping in later steps. The amount of material removed also depends on the thickness of the oxide 52 overlying the control gate, as etching into the gate 14 is to be avoided. The substrate surface therefore has a pair of major surfaces, the first (the nonetched surface) being in a superior plane (above) with respect to the second major surface (the surface formed by etching the substrate). If 5 KÅ of substrate material is removed from the source regions, the substrate in the source areas would be 5K Å below the substrate in the drain regions. Below, for purposes of this disclosure, does not mean the source region is directly below the drain region, but only in a different plane than the drain region. A doping density of between about $10^{13}$ atoms/cm$^3$ and about $10^{15}$ atoms/cm$^3$ of an N-type dopant such as arsenic on both the source and drain side is typically adequate, although other source/drain doping densities may be sufficient. A doping energy of between about 30 keV and about 100 keV is normally sufficient to implant the source/drain to the indicated density.

Wafer processing then continues by means known in the art, for example to form spacers, digit lines, etc.

The recessed floating gate device source creates a sharp source hot electron injector for source side flash programming. The source has an improved sharpness and therefore better electrical properties to accomplish low voltage source-side programming of the EPROM. For example, a drain bias of between 3.0 V and 4.0 V is typically adequate for programming the PROM.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

I claim:

1. A semiconductor device comprising:
   a substrate having a first type conductivity and further having a trench therein, said trench having a sidewall and a bottom;
   a floating gate having a sidewall;
   a control gate having a sidewall,
   wherein said trench sidewall, said floating gate sidewall, and said control gate sidewall are generally aligned vertically,
   a channel region in said substrate having a portion along said trench sidewall and a portion under said floating gate;
   a substrate region under said bottom of said trench having a second type conductivity, different from said first type conductivity,
   wherein said trench sidewall has a substantially first type conductivity.

2. The device of claim 1 wherein said trench sidewall is less than 5,000 Å high.

3. The device of claim 1 wherein said trench sidewall is more than 200 Å high.

4. The device of claim 1 further comprising a protective layer over said control gate.

5. A programmable memory device comprising:
   first and second floating gates each having a sidewall;
   first and second control gates each having a sidewall;
   a substrate having a first type conductivity and further having a trench therein, said trench having first and second sidewalls comprising said first type conductivity;
   a region under a bottom of said trench comprising a second type conductivity different from said first type conductivity,
   wherein said first sidewall of said trench, said first floating gate sidewall, and said first control gate sidewall are generally vertically aligned.

6. The device of claim 5 wherein said second sidewall of said trench, said second floating gate sidewall, and said second control gate sidewall are generally vertically aligned.

7. The device of claim 5 wherein said trench is interposed between said first and second floating gates.

8. The device of claim 5 wherein said trench sidewall is less than 5,000 Å high.

9. The device of claim 5 wherein said trench sidewall is more than 200 Å high.

10. The device of claim 5 further comprising a protective layer over said control gate.

11. A flash memory device comprising:
    first and second floating gates each having a sidewall;
    first and second control gates each having a sidewall;
    a substrate having a trench therein, said trench having first and second sidewalls having a first type conductivity and said trench further having a bottom comprising a second type conductivity different from said first type conductivity forming at least a portion of a transistor source region;
    first and second channel regions each having portions formed along said first and second sidewalls respectively, said trench bottom being electrically separated from said channel regions by said first and second sidewalls;
    wherein said first sidewall of said trench, said first floating sidewall, and said first control gate sidewall align vertically.

12. The device of claim 11 wherein said second sidewall of said trench, said second floating gate sidewall, and said second control gate sidewall align vertically.

13. The device of claim 11 wherein said trench is interposed between said first and second floating gates.

14. The device of claim 11 wherein said trench sidewall is less than 5,000 Å high.

15. The device of claim 11 wherein said trench sidewall is more than 200 Å high.

16. The device of claim 11 wherein said source is a buried source-side injector.

17. The device of claim 11 further comprising a protective layer over said control gate.

18. The memory device of claim 1 wherein said channel is separated from said substrate region having said second type conductivity by said trench sidewall having said first type conductivity.

19. The memory device of claim 5 wherein said channel is separated from said substrate region having said second type conductivity by said trench sidewall having said first type conductivity.

20. The memory device of claim 11 wherein said channel is separated from said substrate region having said second type conductivity by said trench sidewall having said first type conductivity.

* * * * *